United States Patent
Yu (12) 
(10) Patent No.: US 6,228,721 B1
(45) Date of Patent: May 8, 2001

(54) FABRICATION OF METAL OXIDE STRUCTURES WITH DIFFERENT THICKNESSES ON A SEMICONDUCTOR SUBSTRATE

(75) Inventor: Bin Yu, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/602,666

(22) Filed: Jun. 26, 2000

(51) Int. Cl.$^7$ ................................................ H01L 21/8234
(52) U.S. Cl. ............................ 438/275; 438/296; 438/981
(58) Field of Search .................................... 438/275, 276, 438/277, 278, 289, 296, 981

(56) References Cited

U.S. PATENT DOCUMENTS

| | | | |
|---|---|---|---|
| 5,847,432 | * 12/1998 | Nozaki | 438/981 |
| 5,926,729 | * 7/1999 | Tsai et al. | 438/981 |
| 5,989,948 | * 11/1999 | Vines et al. | 438/275 |

* cited by examiner

*Primary Examiner*—Chandra Chaudhari
(74) *Attorney, Agent, or Firm*—Monica H. Choi (57) ABSTRACT

For fabricating a metal oxide structure on a semiconductor substrate, an active device area surrounded by at least one STI (shallow trench isolation) structure is formed in the semiconductor substrate. A layer of metal is deposited on the semiconductor substrate, and the layer of metal contacts the active device area of the semiconductor substrate. A layer of oxygen blocking material is deposited on the layer of metal. An opening is etched through the layer of oxygen blocking material to expose an area of the layer of metal on top of the active device area. A thermal oxidation process is performed to form a metal oxide structure from reaction of oxygen with the area of the layer of metal that is exposed. A thickness of the metal oxide structure is determined by a thickness of the layer of metal, and the layer of oxygen blocking material prevents contact of oxygen with the layer of metal such that the metal oxide structure is formed localized at the area where the layer of metal is exposed. In this manner, the metal oxide structure is formed by localized thermal oxidation of the layer of metal such that a deposition or sputtering process or an etching process is not necessary for formation of the metal oxide structure. In addition, the thickness of the metal oxide structure is determined by controlling the thickness of the layer of metal used for forming the metal oxide structure. Furthermore, these steps may be repeated for another layer of metal having a different thickness for forming a plurality of metal oxide structures having different thicknesses to provide gate dielectrics of MOSFETs (metal oxide semiconductor field effect transistors) having different threshold voltages on the same semiconductor substrate.

14 Claims, 4 Drawing Sheets

FABRICATION OF METAL OXIDE STRUCTURES WITH DIFFERENT THICKNESSES ON A SEMICONDUCTOR SUBSTRATE

TECHNICAL FIELD

The present invention relates generally to fabrication of field effect transistors having scaled-down dimensions, and more particularly, to fabrication of field effect transistors with gate dielectrics of metal oxide structures of different thicknesses on a semiconductor substrate.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Figure 1:
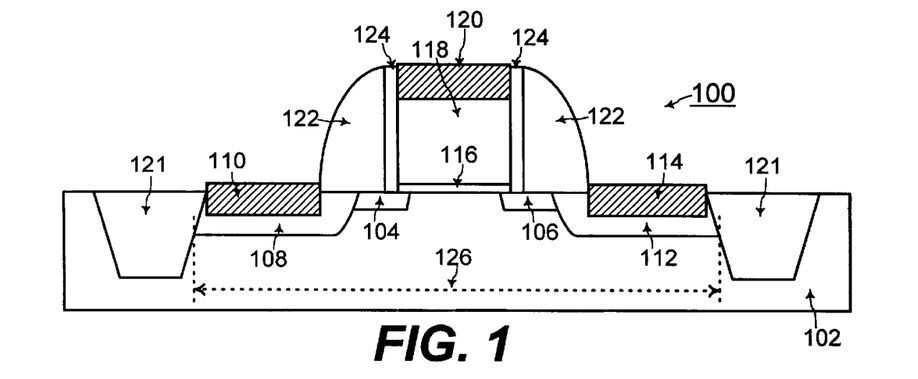
FIG. 1 shows a cross-section view of a conventional MOSFET (Metal Oxide Semiconductor Field Effect Transistor) having a gate electrode and a thin gate dielectric comprised of silicon dioxide ($SiO_2$)

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension 104 and a source extension 106 formed within an active device area 126 of the semiconductor substrate 102. The drain extension 104 and the source extension 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where a MOSFET is fabricated therein.

The MOSFET 100 also includes a spacer 122 disposed on the sidewalls of the gate electrode 118 and the gate dielectric 116. When the spacer 122 is comprised of silicon nitride (SiN), then a spacer liner oxide 124 is deposited as a buffer layer between the spacer 122 and the sidewalls of the gate electrode 118 and the gate dielectric 116.

Conventionally, the gate dielectric 116 for the MOSFET 100 is typically comprised of silicon dioxide ($SiO_2$), and the gate electrode 118 is typically comprised of polysilicon. As the channel length and width dimensions of the MOSFET 100 are scaled down for enhanced speed performance, the thicknesses of the gate dielectric 116 and the gate electrode 118 are also correspondingly scaled down, as known to one of ordinary skill in the art of integrated circuit fabrication. However, as the channel length and width dimensions of the MOSFET 100 are scaled down to tens of nanometers, the thickness of the gate dielectric 116 is also scaled down to tens of angstroms when the gate dielectric 116 is comprised of silicon dioxide ($SiO_2$). With such a thin gate dielectric 116, charge carriers easily tunnel through the gate dielectric 116, as known to one of ordinary skill in the art of integrated circuit fabrication.

When charge carriers tunnel through the gate dielectric 116, gate leakage current undesirably increases resulting in increased static power dissipation and even circuit malfunction. In addition, with charge carriers tunneling through the gate dielectric 116, decreased charge carrier accumulation in the channel of the MOSFET may result in undesirable increase in resistance through the channel of the MOSFET. Furthermore, with the thin gate dielectric 116, the charge accumulation at the gate electrode 118 causes an undesirable increase in charge carrier scattering at the surface of the channel of the MOSFET 100. Such increase in charge carrier scattering in turn results in higher resistance through the channel of the MOSFET.

In light of these disadvantages of the thin gate dielectric 116 when the gate dielectric 116 is comprised of silicon dioxide ($SiO_2$), a gate dielectric having a dielectric constant that is higher than the dielectric constant of silicon dioxide ($SiO_2$) (i.e., a high dielectric constant material) is used for a field effect transistor having scaled down dimensions of tens of nanometers. A dielectric material having a higher dielectric constant has higher thickness for achieving the same capacitance. Thus, when the gate dielectric is comprised of a high dielectric constant material, the gate dielectric has a higher thickness (hundreds of angstroms) than when the gate dielectric is comprised of silicon dioxide ($SiO_2$) (tens of angstroms), for field effect transistors having scaled down dimensions of tens of nanometers.

The gate dielectric with high dielectric constant has higher thickness to minimize charge carrier tunneling through the gate dielectric for field effect transistors having scaled down dimensions of tens of nanometers. Examples of dielectric materials with high dielectric constant include metal oxides such as aluminum oxide ($Al_2O_3$), titanium dioxide ($TiO_2$), or tantalum oxide ($Ta_2O_5$). Such dielectric materials are usually deposited or sputtered onto the semiconductor substrate in the prior art. However, with the deposition and sputtering processes of the prior art, the uniformity of thickness of such dielectric materials for formation of gate dielectrics having scaled down dimensions of hundreds of angstroms is typically unacceptable. In addition, the metal oxides are typically difficult to etch. For example, in a wet etch process, metal residue from the etched metal oxide may undesirably contaminate the semiconductor substrate.

Furthermore, metal oxide structures with different thicknesses may be desired on the same semiconductor substrate. A gate dielectric comprised of a metal oxide structure having a smaller thickness is desired for a MOSFET with a lower threshold voltage for enhanced speed performance of such a MOSFET. On the other hand, a gate dielectric comprised of a metal oxide structure having a larger thickness is desired for a MOSFET with a higher threshold voltage for low-power applications with such a MOSFET.

Thus, a mechanism is desired for effectively fabricating metal oxide structures with different thicknesses on the same semiconductor substrate for use as gate dielectrics of field effect transistors having scaled down dimensions of tens of nanometers.

SUMMARY OF THE INVENTION

Accordingly, in a general aspect of the present invention, a metal oxide structure is fabricated by forming an opening on top of a layer of metal and with localized thermal oxidation of the layer of metal exposed at the opening.

In one embodiment of the present invention, in a method for fabricating at least one metal oxide structure on a semiconductor substrate, a first active device area surrounded by at least one STI (shallow trench isolation) structure is formed in the semiconductor substrate. A first layer of metal is deposited on the semiconductor substrate, and the first layer of metal contacts the first active device area of the semiconductor substrate. A first layer of oxygen blocking material is deposited on the first layer of metal. A first opening is etched through the first layer of oxygen blocking material to expose a first area of the first layer of metal on top of the first active device area. A first thermal oxidation process is performed to form a first metal oxide structure from reaction of oxygen with the first area of the first layer of metal. A thickness of the first metal oxide structure is determined by a thickness of the first layer of metal, and the first layer of oxygen blocking material prevents contact of oxygen with the first layer of metal such that the first metal oxide structure is formed localized at the first area where the first layer of metal is exposed.

In this manner, the metal oxide structure is formed by localized thermal oxidation of the layer of metal such that a deposition or sputtering process or an etching process is not necessary for formation of the metal oxide structure. In addition, the thickness of the metal oxide structure is determined by controlling the thickness of the layer of metal used for forming the metal oxide structure.

In another embodiment of the present invention, the first layer of oxygen blocking material and the first layer of metal are etched away. A second active device area surrounded by at least one STI (shallow trench isolation) structure is formed in the semiconductor substrate. A second layer of oxygen blocking material is formed to cover the first active device area while the second active device area is exposed. A second layer of metal is deposited across structures of the semiconductor substrate, and the second layer of metal contacts the second active device area of the semiconductor substrate. A third layer of oxygen blocking material is deposited on the second layer of metal. A second opening is etched through the third layer of oxygen blocking material to expose a second area of the second layer of metal on top of the second active device area. A second thermal oxidation process is performed to form a second metal oxide structure from reaction of oxygen with the second area of the second layer of metal. A thickness of the second metal oxide structure is determined by a thickness of the second layer of metal, and the third layer of oxygen blocking material prevents contact of oxygen with the second layer of metal such that the second metal oxide structure is formed localized at the second area where the second layer of metal is exposed.

In this manner, metal oxide structures having different thicknesses may be formed in the semiconductor substrate. The thickness of the first metal oxide structure is determined by controlling the thickness of the first layer of metal, and the thickness of the second metal oxide structure is determined by controlling the thickness of the second layer of metal. The thickness of the first layer of metal is controlled to be different from the thickness of the second layer of metal such that the thickness of the first metal oxide structure is different from the thickness of the second metal oxide structure.

The present invention may be used to particular advantage when the first metal oxide structure is a gate dielectric of a first MOSFET (metal oxide semiconductor field effect transistor) having a first threshold voltage, and when the second metal oxide structure is a gate dielectric of a second MOSFET (metal oxide semiconductor field effect transistor) having a second threshold voltage. In that case, when the thickness of the first metal oxide structure is less than the thickness of the second metal oxide structure, the first threshold voltage of the first MOSFET is less than the second threshold voltage of the second MOSFET for fabrication of MOSFETs with different threshold voltages on the semiconductor substrate.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, and 12 refer to elements having similar structure and function.

DETAILED DESCRIPTION

Figure 2:
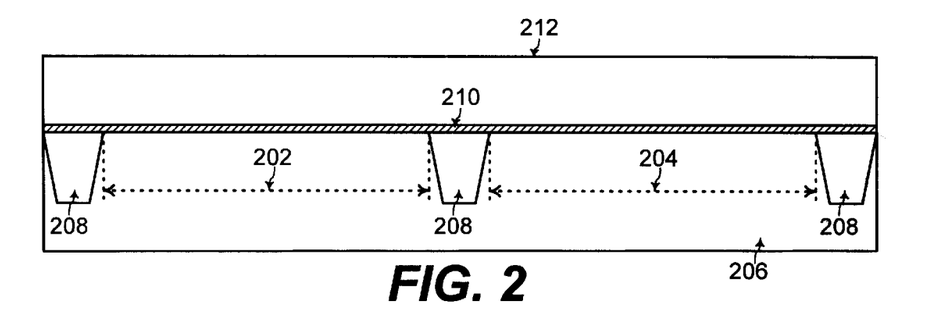
FIGS. 2, 3, 4, 5, 6, 7, 8, 9, 10, 11, and 12 show cross-sectional views for illustrating the steps for fabricating metal oxide structures having different thicknesses for gate dielectrics of field effect transistors using localized thermal oxidation of layers of metal, according to an embodiment of the present invention.

In the cross-sectional view of FIG. 2, a first active device area 202 and a second active device area 204 are formed in a semiconductor substrate 206 by STI (shallow trench isolation) structures 208. STI (shallow trench isolation) technology for electrical isolation of an active device area is known to one of ordinary skill in the art of integrated circuit fabrication.

Further referring to FIG. 2, for formation of a metal oxide structure, a first layer of metal 210 is deposited on the semiconductor substrate 206. The first layer of metal 210 contacts the first active device area 202 of the semiconductor substrate 206. When the metal oxide structure to be formed is comprised of aluminum oxide ($AL_2O_3$), for example, the first layer of metal 210 is comprised of aluminum. When the metal oxide structure to be formed is comprised of titanium dioxide ($TiO_2$), the first layer of metal 210 is comprised of titanium. When the metal oxide structure to be formed is comprised of tantalum oxide ($Ta_2O_5$), the first layer of metal 210 is comprised of tantalum. Processes for deposition of such a layer of metal are known to one of ordinary skill in the art of integrated circuit fabrication.

Further referring to FIG. 2, a first layer of oxygen blocking material 212 is deposited on the first layer of metal 210. The first layer of oxygen blocking material 212 is comprised of a material such as silicon nitride (SiN) wherein oxygen does not easily diffuse. Processes for deposition of such an oxygen blocking material 212 are known to one of ordinary skill in the art of integrated circuit fabrication.

In one embodiment of the present invention, a silicon nitride deposition process is used to deposit a layer of silicon nitride having a thickness in a range of from about 1000 Å (angstroms) to about 2000 Å (angstroms) as the first layer of oxygen blocking material 212 using a relatively low temperature in a range of from about 300° Celsius to about 400° Celsius. Such a relatively low temperature is amenable for preventing diffusion of shallow junctions already formed in other areas of the semiconductor substrate 206.

Figure 3:
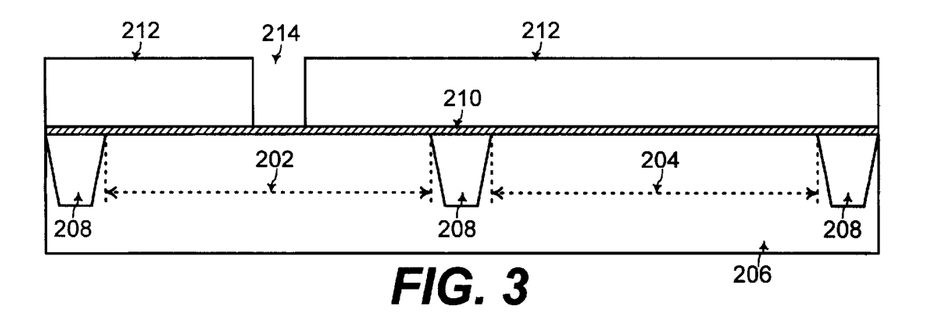

Referring to FIG. 3, a first opening 214 is etched through the first layer of oxygen blocking material 212 to expose a first area of the first layer of metal 210 located on top of the first active device area 202 of the semiconductor substrate 206. When the metal oxide structure to be formed on top of the first active device area 202 is to be used as a gate dielectric of a MOSFET (metal oxide semiconductor field effect transistor), the first opening 214 is sized to the desired dimensions of the gate dielectric of such a MOSFET. Processes for patterning and etching the first opening 214 through the first layer of oxygen blocking material 212 that may be comprised of silicon nitride (SiN) are known to one of ordinary skill in the art of integrated circuit fabrication.

Figure 4:
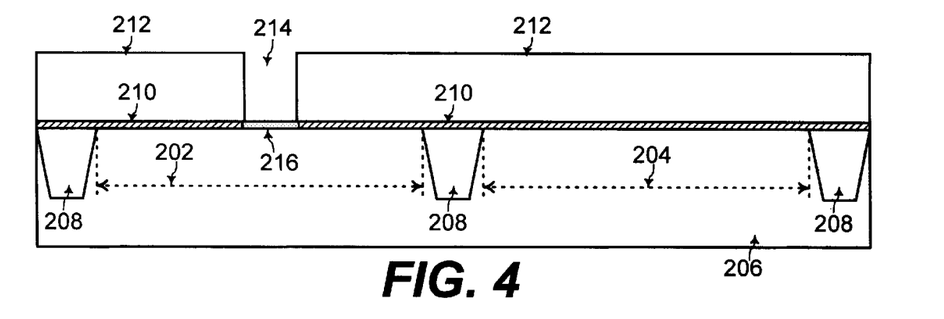

Referring to FIG. 4, a first thermal oxidation process is performed by heating the semiconductor substrate 206 to a temperature in a range of from about 250° Celsius to about 300° Celsius and flowing oxygen gas to the semiconductor substrate 206. Systems for performing thermal oxidation processes are known to one of ordinary skill in the art of electronics. The relatively low temperature used during this thermal oxidation process is amenable for preventing diffusion of shallow junctions already formed in other areas of the semiconductor substrate 206.

During this first thermal oxidation process of FIG. 4, a first metal oxide structure 216 is formed from a reaction of oxygen with the first area of the first layer of metal 210 exposed through the first opening 214. The thickness of the first metal oxide structure 216 formed in this thermal oxidation process is determined by the thickness of the first layer of metal 210. For example, when the first metal oxide structure 216 is to be used as a gate dielectric of a MOSFET (metal oxide semiconductor field effect transistor) having scaled down dimensions of tens of nanometers, the first metal oxide structure 216 has a thickness in a range of from about 150 Å (angstroms) to about 180 (angstroms) when the first metal oxide structure 216 is comprised of aluminum oxide ($Al_2O_3$). In that case, the thickness of the first layer of metal 210 which is comprised of aluminum is controlled to be in a range of from about 100 Å (angstroms) to about 120 Å (angstroms), according to one embodiment of the present invention. Processes for controlling the thickness of the first layer of metal 210 are known to one of ordinary skill in the art of integrated circuit fabrication.

Further referring to FIG. 4, during the first thermal oxidation process for forming the first metal oxide structure 216, the layer of oxygen blocking material 212 prevents contact of oxygen with the first layer of metal 210. Thus, the first metal oxide structure 216 is formed localized at the first area of the first layer of metal 210 that is exposed through the first opening 214.

Figure 5:
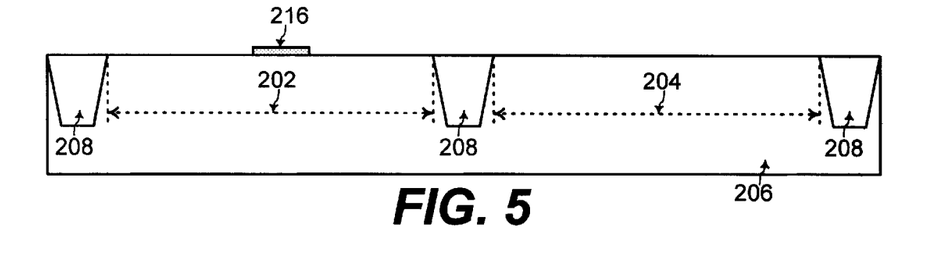

Referring to FIG. 5, the first layer of oxygen blocking material 212 and the first layer of metal 210 are etched away from the semiconductor substrate 206 leaving the first metal oxide structure 216. Processes for etching away the first layer of oxygen blocking material 212 that may be comprised of silicon nitride and for etching away the first layer of metal 210 are known to one of ordinary skill in the art of integrated circuit fabrication.

Figure 6:
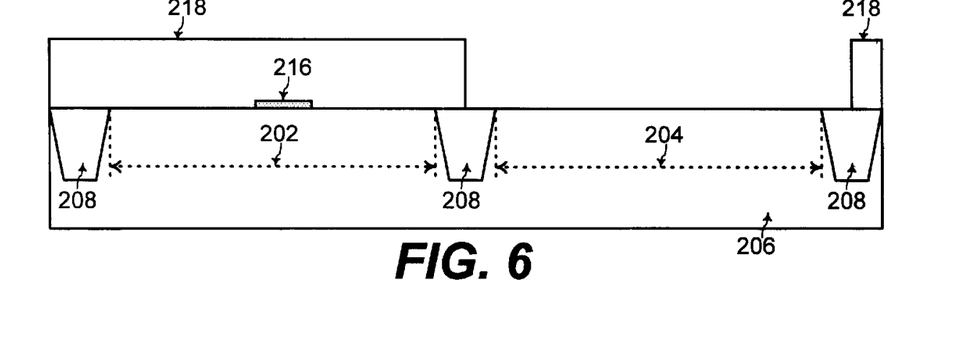

Referring to FIG. 6, a second layer of oxygen blocking material 218 is deposited to cover the first active device area 202 of the semiconductor substrate 206. The second layer of oxygen blocking material 218 is comprised of a material such as silicon nitride (SiN) wherein oxygen does not easily diffuse. Processes for deposition of such an oxygen blocking material 218 are known to one of ordinary skill in the art of integrated circuit fabrication.

In one embodiment of the present invention, a silicon nitride deposition process is used to deposit a layer of silicon nitride as the second layer of oxygen blocking material 218 having a thickness in a range of from about 500 Å (angstroms) to about 1000 Å (angstroms) using a relatively low temperature in a range of from about 300° Celsius to about 400° Celsius. Such a relatively low temperature is amenable for preventing diffusion of shallow junctions already formed in other areas of the semiconductor substrate 206.

Further referring to FIG. 6, the second layer of oxygen blocking material 218 is patterned and etched to expose the second active device area 204 of the semiconductor substrate 206. Processes for patterning and etching the second layer of oxygen blocking material 218 that may be comprised of silicon nitride (SiN) to expose the second active device area 204 are known to one of ordinary skill in the art of integrated circuit fabrication.

Figure 7:
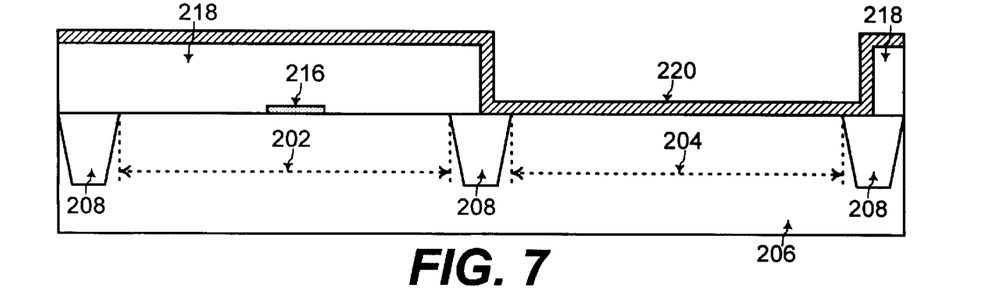

Referring to FIG. 7, for formation of a second metal oxide structure, a second layer of metal 220 is deposited across the structures on the semiconductor substrate 206. The second layer of metal 220 contacts the second active device area 204 of the semiconductor substrate 206. When the second metal oxide structure to be formed is comprised of aluminum oxide ($Al_2O_3$), for example, the second layer of metal 220 is comprised of aluminum. When the second metal oxide structure to be formed is comprised of titanium dioxide ($TiO_2$), the second layer of metal 220 is comprised of titanium. When the second metal oxide structure to be formed is comprised of tantalum oxide ($Ta_2O_5$), the second layer of metal 220 is comprised of tantalum. Processes for deposition of such a layer of metal are known to one of ordinary skill in the art of integrated circuit fabrication.

Figure 8:
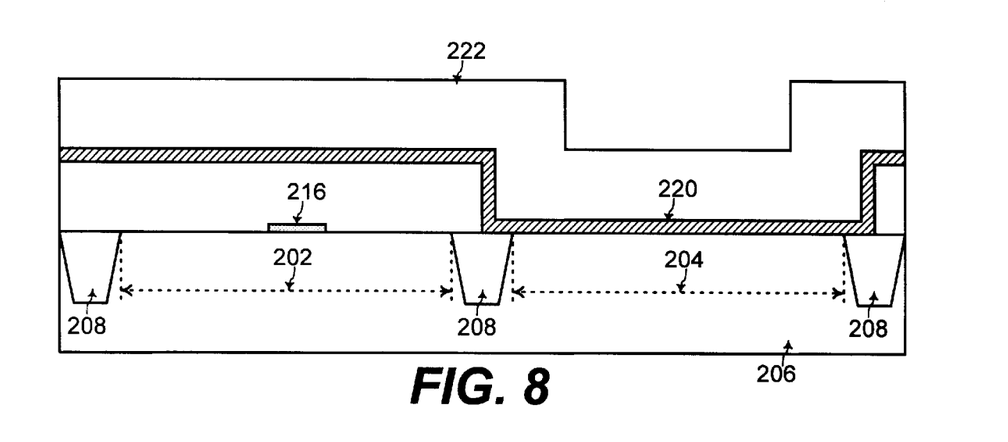

Referring to FIG. 8, a third layer of oxygen blocking material 222 is deposited on the second layer of metal 220. The third layer of oxygen blocking material 222 is comprised of a material such as silicon nitride (SiN) wherein oxygen does not easily diffuse. Processes for deposition of such an oxygen blocking material 222 are known to one of ordinary skill in the art of integrated circuit fabrication.

In one embodiment of the present invention, a silicon nitride deposition process is used to deposit a layer of silicon nitride as the third layer of oxygen blocking material 222 having a thickness in a range of from about 500 Å (angstroms) to about 1000 Å (angstroms) using a relatively low temperature in a range of from about 300° Celsius to about 400° Celsius. Such a relatively low temperature is amenable for preventing diffusion of shallow junctions already formed in other areas of the semiconductor substrate 206.

Figure 9:
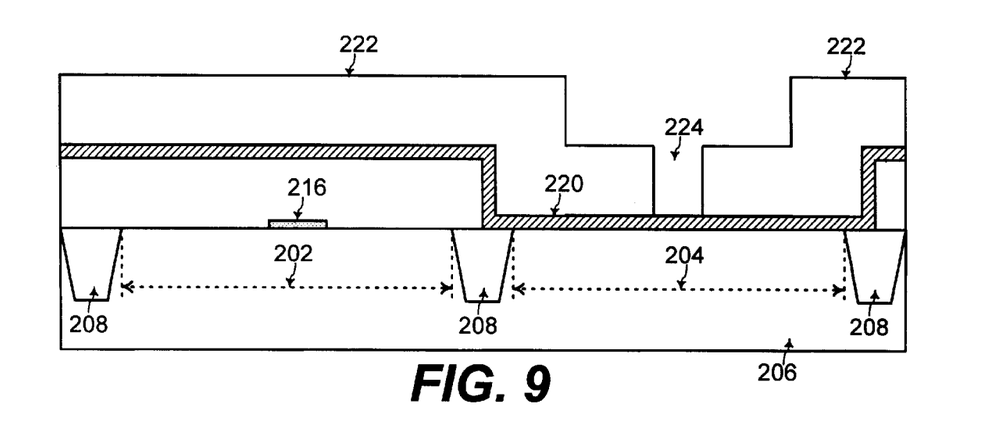

Referring to FIG. 9, a second opening 224 is etched through the third layer of oxygen blocking material 222 to expose a second area of the second layer of metal 220 located on top of the second active device area 204 of the semiconductor substrate 206. When the second metal oxide structure to be formed on top of the second active device area 204 is to be used as a gate dielectric of a MOSFET (metal oxide semiconductor field effect transistor), the second opening 224 is sized to the desired dimensions of the gate dielectric of such a MOSFET. Processes for patterning and etching the second opening 224 through the third layer of oxygen blocking material 222 that may be comprised of silicon nitride (SiN) are known to one of ordinary skill in the art of integrated circuit fabrication.

Figure 10:
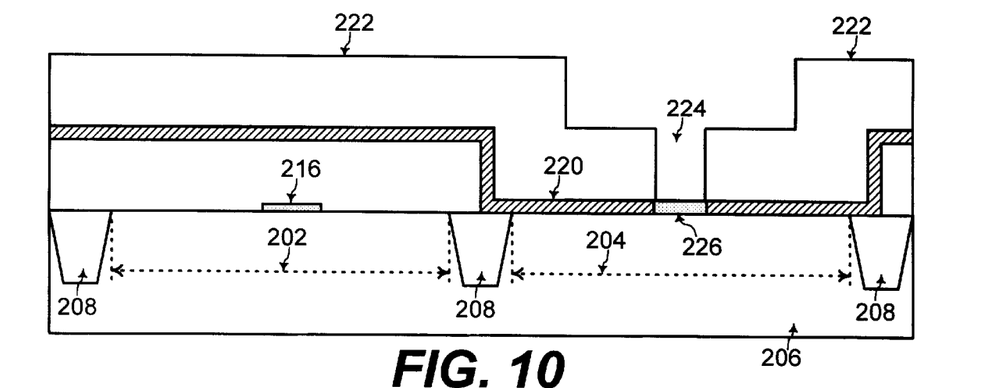

Referring to FIG. 10, a second thermal oxidation process is performed by heating the semiconductor substrate 206 to a temperature in a range of from about 250° Celsius to about 300° Celsius and flowing oxygen gas to the semiconductor substrate 206. Systems for performing thermal oxidation processes are known to one of ordinary skill in the art of electronics. The relatively low temperature used during this thermal oxidation process is amenable for preventing diffusion of shallow junctions already formed in other areas of the semiconductor substrate 206.

During this second thermal oxidation process of FIG. 10, a second metal oxide structure 226 is formed from a reaction of oxygen with the second area of the second layer of metal 220 exposed through the second opening 224. The thickness of the second metal oxide structure 226 formed in this thermal oxidation process is determined by the thickness of the second layer of metal 210. Processes for controlling the thickness of the second layer of metal 220 are known to one of ordinary skill in the art of integrated circuit fabrication. In one embodiment of the present invention, the thickness of the second metal oxide structure 226 is greater than the thickness of the first metal oxide structure 216.

Further referring to FIG. 10, during the second thermal oxidation process for forming the second metal oxide structure 226, the second layer of oxygen blocking material 222 prevents contact of oxygen with the second layer of metal 220. Thus, the second metal oxide structure 226 is formed localized at the second area of the second layer of metal 220 that is exposed through the second opening 224.

Figure 11:
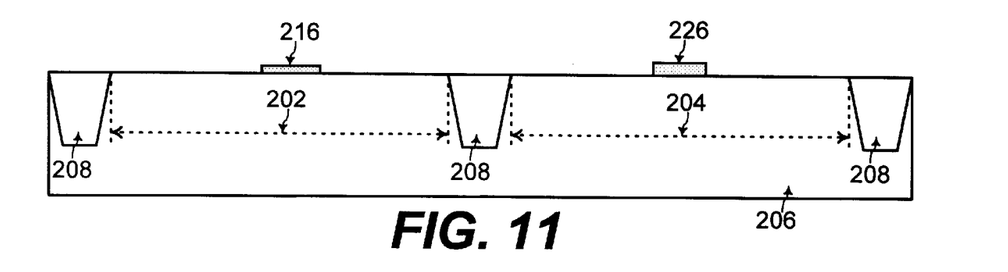

Referring to FIG. 11, the second layer of oxygen blocking material 218, the second layer of metal 220, and the third layer of oxygen blocking material 222 are etched away from the semiconductor substrate 206 leaving the first metal oxide structure 216 and the second metal oxide structure 226. Processes for etching away these layers of oxygen blocking material 218 and 222 that may be comprised of silicon nitride and for etching away the second layer of metal 220 are known to one of ordinary skill in the art of integrated circuit fabrication.

Figure 12:
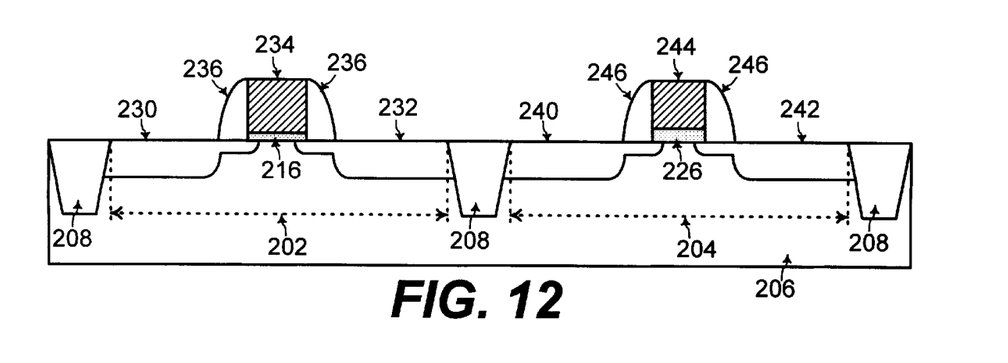

Referring to FIG. 11, the first metal oxide structure 216 is formed on top of the first active device area 202 of the semiconductor substrate 206, and the second metal oxide structure 226 is formed on top of the second active device area 204 of the semiconductor substrate 206. The thickness of the second metal oxide structure 226 is larger than the thickness of the first metal oxide structure 216. Referring to FIG. 12, such metal oxide structures 216 and 226 may be used to particular advantage when the metal oxide structures 216 and 226 are gate dielectrics of MOSFETs (metal oxide semiconductor field effect transistors).

Further referring to FIG. 12, the first metal oxide structure 216 is a gate dielectric of a first MOSFET (metal oxide semiconductor field effect transistor) formed within the first active device area 202 of the semiconductor substrate 206. A first drain junction 230 and a first source junction 232 of the first MOSFET are formed in the first active device area 202. A first gate electrode 234 is formed on the first metal oxide structure 216. First spacers 236 are formed on the sidewalls of the first gate electrode 234 and the first metal oxide 216 for electrically isolating these components of the first MOSFET. Processes for formation of the drain junction 230, the source junction 232, the gate electrode 234, and the spacers 236 for the first MOSFET in the first active device area 202 are known to one of ordinary skill in the art of integrated circuit fabrication.

Additionally referring to FIG. 12, the second metal oxide structure 226 is a gate dielectric of a second MOSFET (metal oxide semiconductor field effect transistor) formed within the second active device area 204 of the semiconductor substrate 206. A second drain junction 240 and a second source junction 242 of the second MOSFET are formed in the second active device area 204. A second gate electrode 244 is formed on the second metal oxide structure 226. Second spacers 246 are formed on the sidewalls of the second gate electrode 244 and the second metal oxide 226 for electrically isolating these components of the second MOSFET. Processes for formation of the drain junction 240, the source junction 242, the gate electrode 244, and the spacers 246 for the second MOSFET in the second active device area 204 are known to one of ordinary skill in the art of integrated circuit fabrication.

The thickness of the metal oxide as the gate dielectric of a MOSFET determines the threshold voltage of the MOSFET. Because the first metal oxide 216 is thinner than the second metal oxide 226, the threshold voltage of the first MOSFET in the first active device area 202 is less than the threshold voltage of the second MOSFET in the second active device area 204. The first MOSFET in the first active device area 202 with the lower threshold voltage has higher speed performance for high-speed integrated circuit applications. On the other hand, the second MOSFET in the second active device area 204 with the higher threshold voltage has lower current dissipation and is amenable for low-power integrated circuit applications.

In this manner, with higher thickness of a gate dielectric of a MOSFET when the gate dielectric is comprised of a metal oxide, charger carrier tunneling through the gate dielectric is reduced such that static power dissipation through the gate of the MOSFET is reduced for MOSFETs having scaled down dimensions of tens of nanometers. In addition, with minimized charger carrier tunneling through the gate dielectric, charge carrier accumulation in the channel of the MOSFET is not minimized such that resistance through the channel of MOSFET is not increased. Minimized resistance through the channel of the MOSFET enhances the speed performance of the MOSFET.

With the described embodiment of the present invention, a metal oxide structure is formed by localized thermal oxidation of a layer of metal such that a deposition or sputtering process or an etching process is not necessary for formation of the metal oxide structure. In addition, the thickness of the metal oxide structure is determined by controlling the thickness of the layer of metal used for forming the metal oxide structure. In addition, metal oxide structures having different thicknesses may be formed on the same semiconductor substrate. The thickness of the first metal oxide structure is determined by controlling the thickness of the first layer of metal for forming the first metal oxide structure, and the thickness of the second metal oxide structure is determined by controlling the thickness of the second layer of metal for forming the second metal oxide structure.

The thickness of the first layer of metal is controlled to be different from the thickness of the second layer of metal such that the thickness of the first metal oxide structure is different from the thickness of the second metal oxide structure. This aspect of the present invention may be used to particular advantage when the first metal oxide structure is a gate dielectric of a first MOSFET (metal oxide semiconductor field effect transistor) having a first threshold voltage, and when the second metal oxide structure is a gate dielectric of a second MOSFET (metal oxide semiconductor field effect transistor) having a second threshold voltage. In that case, when the thickness of the first metal oxide structure is less than the thickness of the second metal oxide structure, the first threshold voltage of the first MOSFET is less than the second threshold voltage of the second MOSFET for fabrication of MOSFETs with different threshold voltages on the same semiconductor substrate.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "top," "sidewall," and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for fabricating at least one metal oxide structure on a semiconductor substrate, the method including the steps of:
   A. forming a first active device area surrounded by at least one STI (shallow trench isolation) structure in said semiconductor substrate;
   B. depositing a first layer of metal on said semiconductor substrate, wherein said first layer of metal contacts said first active device area of said semiconductor substrate;
   C. depositing a first layer of oxygen blocking material on said first layer of metal;
   D. etching a first opening through said first layer of oxygen blocking material to expose a first area of said first layer of metal on top of said first active device area; and
   E. performing a first thermal oxidation process to form a first metal oxide structure from reaction of oxygen with said first area of said first layer of metal, wherein a thickness of said first metal oxide structure is determined by a thickness of said first layer of metal, and wherein said first layer of oxygen blocking material prevents contact of oxygen with said first layer of metal such that said first metal oxide structure is formed localized at said first area where said first layer of metal is exposed.

2. The method of claim 1, further including the steps of:
   F. etching away said first layer of oxygen blocking material and said first layer of metal;
   G. forming a second active device area surrounded by at least one STI (shallow trench isolation) structure in said semiconductor substrate;
   H. forming a second layer of oxygen blocking material to cover said first active device area, wherein said second active device area is exposed;
   I. depositing a second layer of metal across structures of said semiconductor substrate, wherein said second layer of metal contacts said second active device area of said semiconductor substrate;
   J. depositing a third layer of oxygen blocking material on said second layer of metal;
   K. etching a second opening through said third layer of oxygen blocking material to expose a second area of said second layer of metal on top of said second active device area; and
   L. performing a second thermal oxidation process to form a second metal oxide structure from reaction of oxygen with said second area of said second layer of metal, wherein a thickness of said second metal oxide structure is determined by a thickness of said second layer of metal, and wherein said third layer of oxygen blocking material prevents contact of oxygen with said second layer of metal such that said second metal oxide structure is formed localized at said second area where said second layer of metal is exposed.

3. The method of claim 2, wherein the thickness of said first metal oxide structure is different from the thickness of said second metal oxide structure.

4. The method of claim 2, wherein said first metal oxide structure is comprised of one of aluminum oxide ($Al_2O_3$), titanium oxide ($TiO_2$), and tantalum oxide ($Ta_2O_5$).

5. The method of claim 2, wherein said second metal oxide structure is comprised of one of aluminum oxide ($Al_2O_3$), titanium oxide ($TiO_2$), and tantalum oxide ($Ta_2O_5$).

6. The method of claim 2, wherein said first, second, and third layers of oxygen blocking material are comprised of silicon nitride (SiN).

7. The method of claim 2, wherein the thickness of said first metal oxide structure and the thickness of said second metal oxide structure are in a range of from about 150 Å (angstroms) to about 180 Å (angstroms).

8. The method of claim 2, wherein said first thermal oxidation process and said second thermal oxidation process are performed with a temperature in a range of from about 250° Celsius to about 300° Celsius.

9. The method of claim 2, wherein the thickness of said first metal oxide structure is less than the thickness of said second metal oxide structure, and wherein said first metal oxide structure is a gate dielectric of a first MOSFET (metal oxide semiconductor field effect transistor) having a first threshold voltage, and wherein said second metal oxide structure is a gate dielectric of a second MOSFET (metal oxide semiconductor field effect transistor) having a second threshold voltage, and wherein said first threshold voltage is less than said second threshold voltage.

10. The method of claim 1, wherein said first metal oxide structure is comprised of one of aluminum oxide ($Al_2O_3$), titanium oxide ($TiO_2$), and tantalum oxide ($Ta_2O_5$).

11. The method of claim 1, wherein said first layer of oxygen blocking material is comprised of silicon nitride (SiN).

12. The method of claim 1, wherein the thickness of said first metal oxide structure is in a range of from about 150 Å (angstroms) to about 180 Å (angstroms).

13. The method of claim 2, wherein said first thermal oxidation process is performed with a temperature in a range of from about 250° Celsius to about 300° Celsius.

14. A method for fabricating a plurality of metal oxide structures having different thicknesses on a semiconductor substrate, the method including the steps of:
   A. forming a first active device area surrounded by at least one STI (shallow trench isolation) structure in said semiconductor substrate;
   B. forming a second active device area surrounded by at least one STI (shallow trench isolation) structure in said semiconductor substrate;

C. depositing a first layer of metal on said semiconductor substrate, wherein said first layer of metal contacts said first active device area of said semiconductor substrate;

D. depositing a first layer of oxygen blocking material on said first layer of metal;

E. etching a first opening through said first layer of oxygen blocking material to expose a first area of said first layer of metal on top of said first active device area;

F. performing a first thermal oxidation process to form a first metal oxide structure from reaction of oxygen with said first area of said first layer of metal, wherein a thickness of said first metal oxide structure is determined by a thickness of said first layer of metal, and wherein said first layer of oxygen blocking material prevents contact of oxygen with said first layer of metal such that said first metal oxide structure is formed localized at said first area where said first layer of metal is exposed;

G. etching away said first layer of oxygen blocking material and said first layer of metal;

H. forming a second layer of oxygen blocking material to cover said first active device area, wherein said second active device area is exposed;

I. depositing a second layer of metal across structures of said semiconductor substrate, wherein said second layer of metal contacts said second active device area of said semiconductor substrate;

J. depositing a third layer of oxygen blocking material on said second layer of metal;

K. etching a second opening through said third layer of oxygen blocking material to expose a second area of said second layer of metal on top of said second active device area; and L. performing a second thermal oxidation process to form a second metal oxide structure from reaction of oxygen with said second area of said second layer of metal, wherein a thickness of said second metal oxide structure is determined by a thickness of said second layer of metal, and wherein said second layer of oxygen blocking material prevents contact of oxygen with said second layer of metal such that said second metal oxide structure is formed localized at said second area where said second layer of metal is exposed;

and wherein the thickness of said first metal oxide structure is different from the thickness of said second metal oxide structure;

and wherein said first metal oxide structure and said second metal oxide structure are comprised of one of aluminum oxide ($Al_2O_3$), titanium oxide ($TiO_2$), and tantalum oxide ($Ta_2O_5$);

and wherein said first, second, and third layers of oxygen blocking material are comprised of silicon nitride (SiN);

and wherein the thickness of said first metal oxide structure and the thickness of said second metal oxide structure are in a range of from about 150 Å (angstroms) to about 180 Å (angstroms);

and wherein said first thermal oxidation process and said second thermal oxidation process are performed with a temperature in a range of from about 250° Celsius to about 300° Celsius;

and wherein the thickness of said first metal oxide structure is less than the thickness of said second metal oxide structure, and wherein said first metal oxide structure is a gate dielectric of a first MOSFET (metal oxide semiconductor field effect transistor) having a first threshold voltage, and wherein said second metal oxide structure is a gate dielectric of a second MOSFET (metal oxide semiconductor field effect transistor) having a second threshold voltage, and wherein said first threshold voltage is less than said second threshold voltage.

\* \* \* \* \*